(12) United States Patent
Baskett

(10) Patent No.: US 7,196,549 B2
(45) Date of Patent: Mar. 27, 2007

(54) INTERFACE SYSTEM AND METHOD THEREFOR

(75) Inventor: Ira E. Baskett, Tempe, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 176 days.

(21) Appl. No.: 11/009,586

(22) Filed: Dec. 13, 2004

(65) Prior Publication Data

US 2006/0125527 A1 Jun. 15, 2006

(51) Int. Cl.
*H03K 19/0175* (2006.01)

(52) U.S. Cl. .......................... 326/89; 326/26
(58) Field of Classification Search ............... 326/26, 326/27, 30, 82, 89, 90
See application file for complete search history.

(56) References Cited

U.S. PATENT DOCUMENTS

| 5,811,984 A | 9/1998 | Long et al. ................. 326/30 |
| 5,994,923 A * | 11/1999 | Navabi ..................... 326/89 |
| 6,297,685 B1 * | 10/2001 | Ewen et al. ............... 327/513 |
| 6,621,308 B2 * | 9/2003 | Tinsley et al. ............. 327/108 |

OTHER PUBLICATIONS

"An Outline of Design Techniques for Linear Integrated Circuits", by Hans R. Camenzind and Alan B. Grebene, IEEE Journal of Solid State Circuits, vol. SC-4, No. 3, Jun. 1969, pp. 110-122.

* cited by examiner

*Primary Examiner*—Don P. Le
(74) *Attorney, Agent, or Firm*—Robert F. Hightower

(57) ABSTRACT

In one embodiment, a differential transistor pair of an ECL differential amplifier is formed on two different semiconductor die.

18 Claims, 4 Drawing Sheets

INTERFACE SYSTEM AND METHOD THEREFOR

BACKGROUND OF THE INVENTION

The present invention relates, in general, to electronics, and more particularly, to methods of forming semiconductor devices and structure.

In the past, the semiconductor industry utilized various methods and structures for interfacing a high-speed transmitter and a high-speed receiver. Of particular interest was high-speed emitter coupled logic (ECL) transmitter and receiver devices. ECL transmitters and receivers typically were used in applications that desired signals with low jitter and low skew between signals. The trend to lower and lower power supply voltages made it difficult to for ECL transmitter and receiver devices to function properly. Because the ECL devices were referenced to the top rail of the power supply voltage, the decreased power supply voltages did not leave sufficient margins to allow for the internal voltage drops of the ECL circuits. As the power supply voltages approached an operating value of about two (2) volts, it became very difficult to produce ECL transmitter and receiver devices that functioned properly.

Accordingly, it is desirable to have a high speed transmitter and receiver that can interface at low power supply voltages.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor.

DETAILED DESCRIPTION OF THE DRAWINGS

Figure 1:
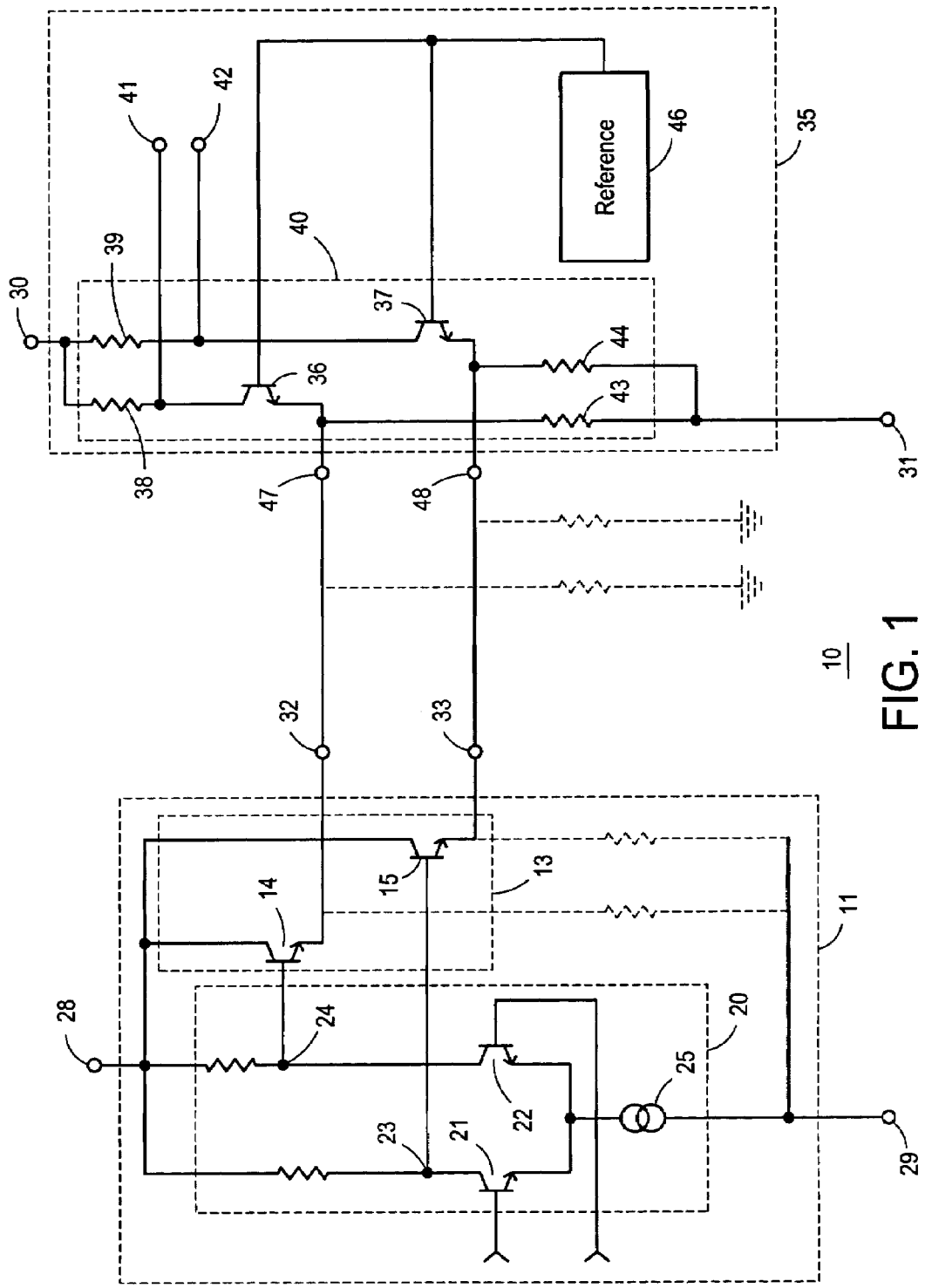
FIG. 1 schematically illustrates a portion of an embodiment of a transmitter and receiver interface system in accordance with the present invention.

FIG. 1 schematically illustrates an embodiment of a portion of an ECL system 10 that interfaces at low power supply voltages. System 10 includes a transmitter device 11 that includes a voltage follower transmitter 13. System 10 also includes a receiver device 35 that includes a voltage follower receiver 40. Transmitter device 11 receives power between a power input 28 and a power return 29 of device 11. Device 11 typically includes an ECL logic device 20 such as an ECL gate or ECL buffer that is used to form signals for transmission to device 35. Device 20 has transistors 21 and 22 that are coupled as a differential pair of a differential amplifier, and also has a current source 25 that assists in establishing the common mode voltage of device 20. Device 20 receives a differential ECL signal at the bases of transistors 21 and 22 and forms a differential signal for transmission on output nodes 23 and 24. As is well known in the art, the output signal of device 20 is an analog signal that has a common mode voltage. The output signal varies around this common mode voltage based on the input signal applied to the bases of transistors 21 and 22. Voltage follower transmitter device 11 includes emitter follower coupled transistors 14 and 15. Transistors 14 and 15 are configured to receive the respective voltages on nodes 23 and 24 of device 20 and form output signals at respective outputs 32 and 33 of device 11.

Device 35 includes voltage follower receiver 40 and a voltage reference generator or reference 46. Receiver 40 receives the output of transmitter 13 and responsively forms an output signal between outputs 41 and 42 that is representative of the signal that is applied to the bases of transistors 21 and 22. Device 35 typically receives power between a power input 30 and a power return 31. In some systems, inputs 28 and 30 may be connected together and returns 29 and 31 may also be connected together. Voltage follower receiver 40 has transistors 36 and 37 that are configured as cascode transistors, respective collector resistors 38 and 39, and respective termination resistors 43 and 44. The emitter of transistors 36 and 37 are configured to receive the output signals from outputs 32 and 33 through a connection to inputs 47 and 48 of device 35. Termination resistors 43 and 44 typically are connected between return 31 and the emitter of respective transistors 36 and 37. The value of resistors 43 and 44 is selected to be approximately equal to the characteristic impedance of the signal path that connects outputs 32 and 33 to inputs 47 and 48. In some embodiments, resistors 43 and 44 may be omitted from device 35 and may be connected externally to device 11 and device 35 as illustrated by the dashed lines external to device 11 and device 35. In other embodiments, resistors 43 and 44 may be formed internally to device 11 as illustrated by the resistors shown in the dashed lines internal to device 11.

The signal that is applied to the bases of transistors 21 and 22 is inverted on nodes 23 and 24. Transistors 14 and 15 receive the signal from nodes 24 and 23, and shift the signal down in voltage by the value of the emitter-base voltage (Vbe) of transistors 14 and 15. As the value of the voltage on node 24 increases, transistor 14 conducts more current, thus, the voltage on output 32 increases causing transistor 36 to decrease current conduction which increases the value of the voltage on output 41. During that same time, the value of the voltage on node 23 decreases causing transistor 15 to turn-off, thus, the voltage on output 33 decreases which increases the current flowing through transistor 37 thereby decreasing the voltage on output 42. Thus, transistors 36 and 37 receive the output signal and shift it up in voltage so that the signal on outputs 41 and 42 are referenced to power input 30. Consequently, the value of the voltage between outputs 41 and 42 is substantially equal to the value of the voltage applied between the bases of transistors 22 and 21 respectively. As will be understood by those skilled in the art, the value of the voltages on outputs 32, 33, 41, and 42 swings around the respective common mode voltages of transmitter 13 and receiver 40, thus, transmitter 13 and receiver 40, including transistors 14, 15, 36, and 37, operate as on-off switches and as is well known to those skilled in the art. Additionally, it should be noted that configuring transistors 14 and 15 to substantially turn-off when the respective signal on nodes 24 and 23 decreases reduces negative edge ringing on outputs 32 and 32. Forming receiver 40 to be devoid of active pull-downs assists in reducing the negative edge ringing.

Since transistors 14 and 15 are configured as emitter followers, the voltages at nodes 23 and 24 only have to swing as high as the Vbe of respective transistors 15 and 14 in order to couple the signal across the respective transistor. Thus, the power supply voltage between input 28 and return 29 can be very low and device 11, including transmitter 13, will generate the proper output signals. Additionally, receiver 40 translates the voltage up so that the signals are referenced to power input 30. This, translates the signals in voltage by more than the value of the Vbe of transistors 36 and 37, thus, the power supply voltage between input 30 and return 31 can be very low and device 35, including receiver 40, will generate the proper output signals on outputs 41 and 42. In one example embodiment, the value of the power supply voltage applied between inputs 28 and 30 relative to respective returns 29 and 31 was selected to be approximately two volts. In this example embodiment, device 11 transmitted signals that were received by device 35.

As can be seen, emitter follower transistor 14 and cascode connected transistor 36 form a differential pair of a differential amplifier. Because the base of transistor 36 is driven by a reference voltage, the differential amplifier formed by transistors 14 and 36 functions similarly to a single ended ECL gate or other single ended ECL logic element. Additionally, transistors 15 and 37 form a similar differential pair of a differential amplifier that forms a signal on output 42.

To implement this function, the emitters of transistors 21 and 22 are commonly connected to a first terminal of current source 25 which has a second terminal connected to return 29. The collectors of transistors 21 and 22 are connected to respective nodes 23 and 24. The collectors of transistors 21 and 22 are also connected to input 28 through collector resistors. The base of transistor 14 is connected to node 24 and the base of transistor 15 is connected to node 23. A collector of transistors 14 and 15 is connected to input 28. An emitter of transistors 14 and 15 is connected to respective outputs 32 and 33. A collector of transistors 36 and 37 is connected to input 30 through respective resistors 38 and 39. The base of transistors 36 and 37 is connected to an output of reference 46 in order to receive the reference voltage. An emitter of transistors 36 and 37 is connected to a first terminal of respective resistors 43 and 44 and to respective inputs 47 and 48. A second terminal of resistors 43 and 44 is connected to return 31.

Figure 2:
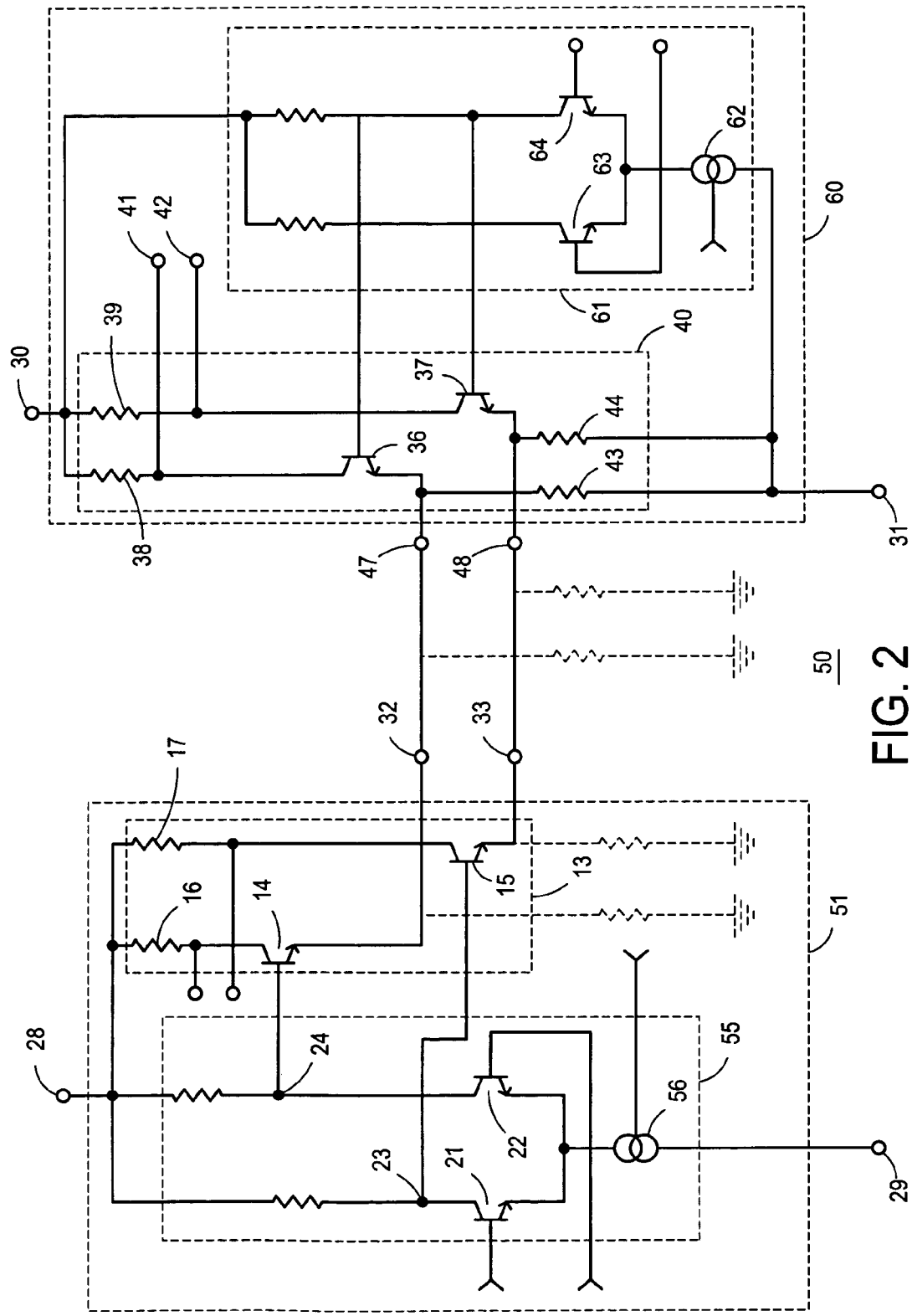
FIG. 2 schematically illustrates an alternate embodiment of the transmitter and receiver interface system of FIG. 1 in accordance with the present invention.

FIG. 2 schematically illustrates a portion of an embodiment of an interface system 50 that is an alternate embodiment of interface system 10 explained in the description of FIG. 1. System 50 includes a transmitter device 51 that is an alternate embodiment of device 11. System 50 also includes a receiver device 60. Transmitter device 51 and receiver device 60 are configured for bi-directional signal transmission.

Device 51 includes an ECL logic device 55 that is an alternate embodiment of device 20 explained in the description of FIG. 1. Additionally voltage follower transmitter 13 includes resistors 16 and 17 that are connected between input 28 and the collectors of respective transistors 14 and 15. Resistors 16 and 17 facilitate transmitter 13 operating as a receiver as well as a transmitter. Device 55 receives an enable signal that is used to enable and disable a current source 56 in order to enable and disable the operation of device 55 in order to facilitate the bi-directional signal transmission. Device 60 includes receiver 40 and an ECL logic device 61 that is the same as device 55. Device 61 also facilitates the bi-directional signal transmission. When device 51 is transmitting a signal to device 60, device 55 is enabled in order to provide the signal for transmission, however, device 61 is disabled so that receiver 40 may receive the signal as explained in the description of FIG. 1. While device 61 is disabled, device 61 provides the reference signals to receiver 40 to facilitate the operation as explained in the description of FIG. 1. When device 60 is transmitting a signal to device 51, device 55 is disabled and device 61 is enabled. During this operation, receiver 40 functions as a transmitter similar to transmitter 13 as explained in the description of FIG. 1, and transmitter 13 functions as a receiver similar to receiver 40 as explained in the description of FIG. 1.

In order to implement this functionality of devices 51 and 60, current source 56 of device 55 has an enable input configured to receive a signal for enabling and disabling source 56. A first terminal of resistor 16 is connected to input 28 and a second terminal of resistor 16 is connected to the collector of transistor 14. A first terminal of resistor 17 is connected to input 28 and a second terminal of resistor 17 is connected to the collector of transistor 15. Current source 62 of device 61 also has an enable input configured to receive a signal for enabling and disabling source 62. A first terminal of source 62 is connected to return 31 and a second terminal of source 62 is connected to the emitters of transistors 63 and 64. The collectors of transistors 63 and 64 are connected to the base of respective transistors 36 and 37, and are also connected to input 30 through collector resistors. The bases of transistors 63 and 64 are configured to receive a signal for transmission.

Figure 3:
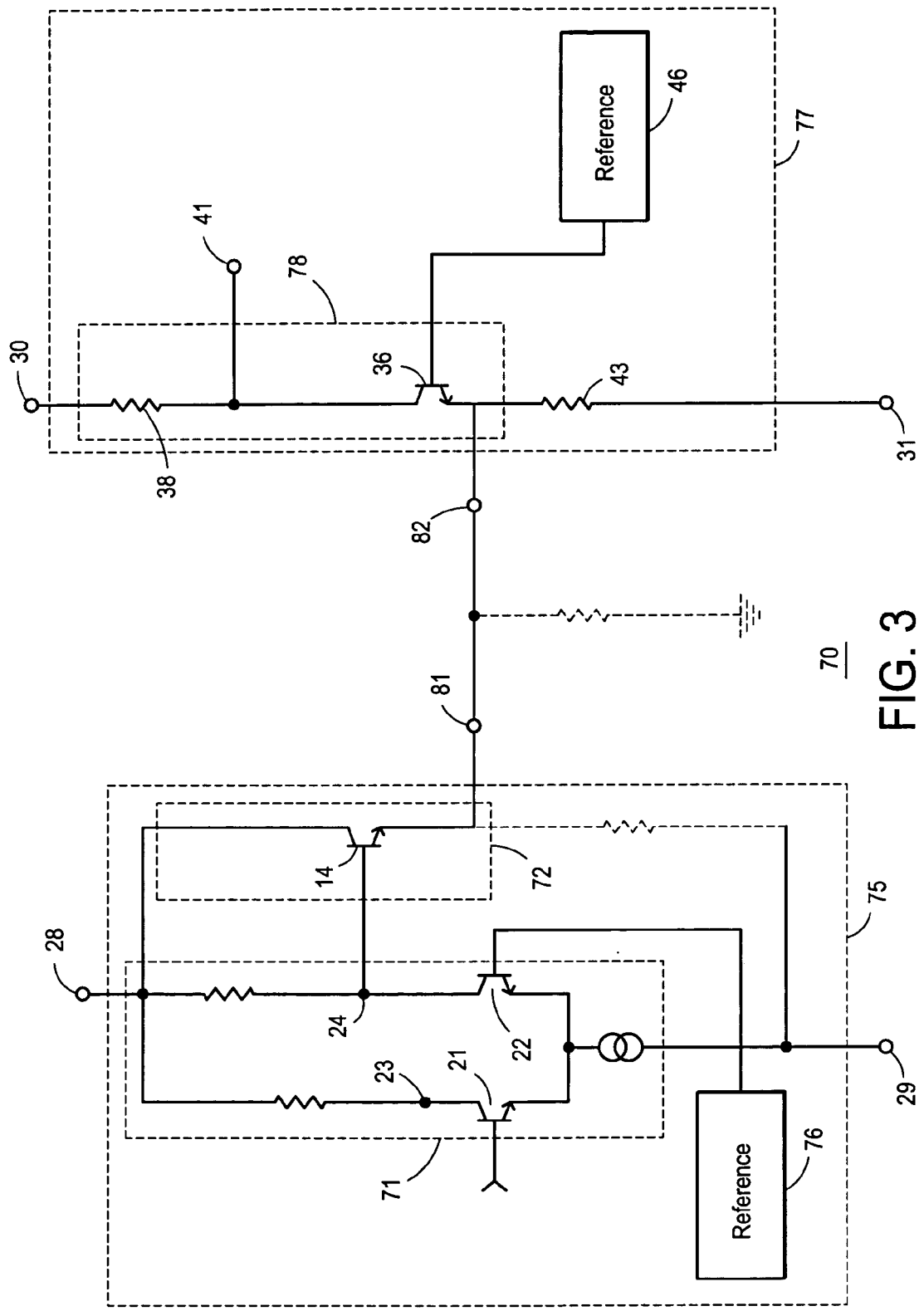
FIG. 3 schematically illustrates a portion of another embodiment of a transmitter and receiver interface system in accordance with the present invention.

FIG. 3 schematically illustrates a portion of an embodiment of another interface system 70. System 70 is a single ended interface system instead of the differential interface system explained in the descriptions of FIG. 1 and FIG. 2. System 70 includes a transmitter device 75 that is an alternate embodiment of device 11 and a receiver device 77 that is an alternate embodiment of device 35 (FIG. 1). Device 75 includes a single ended ECL device 71 such as an ECL gate or ECL buffer, a voltage follower transmitter 72, and a reference 76 that forms a reference voltage that is received by device 71. Transmitter 72 functions similarly to one-half of transmitter 13 of FIG. 1. Device 77 includes a voltage follower receiver 78 that functions similarly to one-half of receiver 40 of FIG. 1.

Device 71 receives the reference signal on a base of transistor 22, receives a signal on a base of transistor 21, and forms an output signal on node 24. Transmitter 72 receives the voltage on node 24 and forms an output signal on an output terminal 81 of device 75. Device 77 receives the output signal from transmitter 72 on an input 82 of device 77. Receiver 78 receives the output signal on an emitter of transistor 36 and forms an output voltage on output 41. As can be seen in FIG. 3, transmitter 72 and receiver 78 each are one-half of a differential pair of a differential amplifier and when coupled together through the interface system form a differential amplifier.

Figure 4:
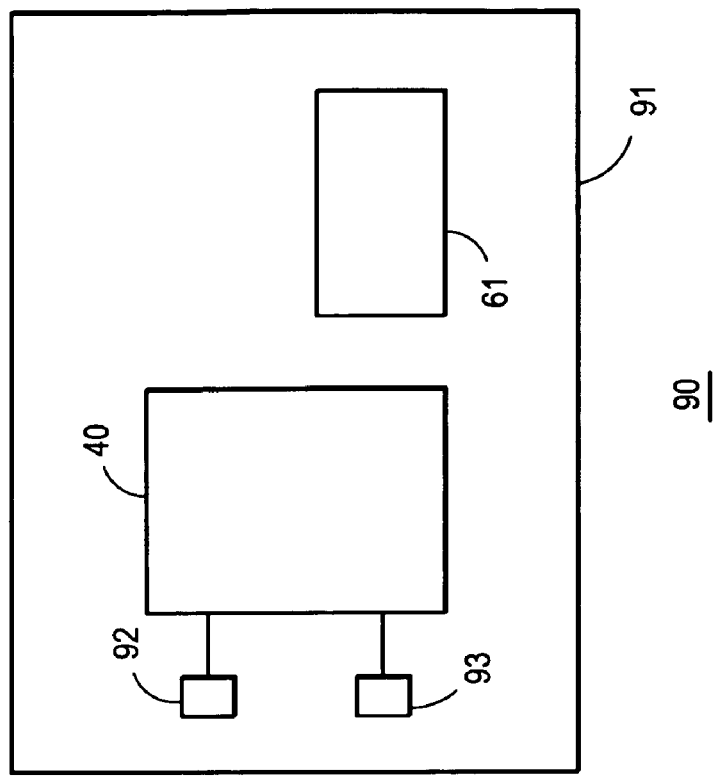
FIG. 4 schematically illustrates a plan view of a semiconductor die in accordance with the present invention.
Figure 4:
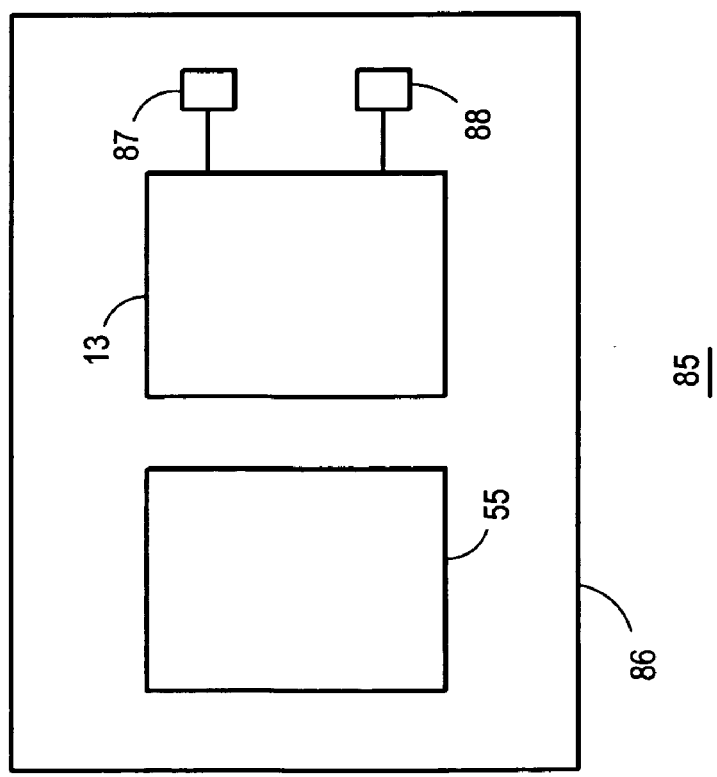

FIG. 4 schematically illustrates an enlarged plan view of a portion of an embodiment of a semiconductor device 85 and a semiconductor device 90. Semiconductor device 85 is formed on a semiconductor die 86 and semiconductor device 90 is formed on a semiconductor die 91. Device 55 and transmitter 13 are formed on die 86, and receiver 40 is formed on die 91. Device 85 includes attachment points 87 and 88, such as bonding pads, that are coupled to respective outputs 32 and 33 of transmitter 13. Device 90 includes attachment points 92 and 93 that are coupled to respective inputs 47 and 48 of receiver 40. Die 86 and 91 may also include other circuits that are not shown in FIG. 4 for simplicity of the drawing. Device 55 and transmitter 13 are formed on die 86 by semiconductor manufacturing techniques that are well known to those skilled in the art. Similarly, receiver 40 and device 61 are formed on die 91 by semiconductor manufacturing techniques that are well known to those skilled in the art. Alternately, device 20 may replace device 55 and reference 46 may replace device 61.

In view of all of the above, it is evident that a novel device and method is disclosed. Included, among other features, is forming a differential transistor pair of an ECL differential amplifier on two different semiconductor die. The two transistors of the differential pair, for example transistors 14 and 36, are connected together externally to the two semiconductor die such as through the external signal path. The external connection facilitates the two transistors functioning as the ECL differential amplifier.

While the invention is described with specific preferred embodiments, it is evident that many alternatives and variations will be apparent to those skilled in the semiconductor arts. More specifically the invention has been described for a particular ECL device structure using NPN transistors, although the method is directly applicable to other bipolar transistors, as well as to MOS, BiCMOS, metal semiconductor FETs (MESFETs), HFETs, and other transistor structures. For example, the NPN emitter follower transistors may be replaced with N-channel source follower transistors. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. An interface system comprising:
a first semiconductor device having a transmitter device;
a first voltage follower of the transmitter device having a first current carrying electrode coupled to receive a first power supply voltage, and a second current carrying electrode coupled to an output terminal of the first semiconductor device;
a second semiconductor device having a receiver device; and
a cascode transistor of the second semiconductor device having a first current carrying electrode coupled to receive a second power supply voltage, and a second current carrying electrode coupled to an input terminal of the receiver device wherein the cascode transistor is devoid of an active pull-down.

2. The interface system of claim 1 wherein the transmitter device is formed on a first semiconductor die and the receiver device is formed on a second semiconductor die.

3. The interface system of claim 1 wherein the first voltage follower is an emitter follower and the cascode transistor is configured as a common base.

4. The interface system of claim 1 wherein the first voltage follower is devoid of an active pull-down device coupled to the second current carrying electrode.

5. The interface system of claim 1 wherein the first voltage follower is a source follower.

6. The interface system of claim 1 further including a termination resistor coupled to the second current carrying electrode of the cascade transistor.

7. The interface system of claim 1 wherein a control electrode of the first voltage follower is coupled to receive a signal to be transmitted to the receiver device.

8. A method of forming a differential amplifier comprising:
forming a first transistor of a differential pair as a portion of a first semiconductor device; and
configuring the first transistor to receive a signal from a second transistor of the differential pair that is external to the first semiconductor device wherein a first current carrying electrode of the first transistor is devoid of a coupling to an active pull-down device.

9. The method of claim 8 wherein configuring the first transistor to receive the signal from the second transistor includes forming the second transistor on a second semiconductor device.

10. The method of claim 8 wherein forming the first transistor of the differential pair as the portion of the first semiconductor device includes forming the first semiconductor device on a first semiconductor die.

11. The method of claim 10 wherein configuring the first transistor to receive the signal from the second transistor includes forming the second transistor on a second semiconductor die.

12. The method of claim 8 wherein configuring the first transistor to receive the signal from the second transistor includes coupling a termination resistor to a first current carrying electrode of the first transistor.

13. The method of claim 8 wherein configuring the first transistor to receive the signal from the second transistor includes coupling the first current carrying electrode of the first transistor to an input terminal of the first semiconductor device.

14. The method of claim 13 further including coupling a resistor in series between the first current carrying electrode of the first transistor and a power supply terminal of the first semiconductor device.

15. The method of claim 8 wherein configuring the first transistor to receive the signal from the second transistor includes coupling a second current carrying electrode of the first transistor to receive an operating voltage.

16. The method of claim 8 wherein configuring the first transistor to receive the signal from the second transistor of the differential pair that is external to the first semiconductor device includes configuring the first transistor to operate in a linear region of the first transistor.

17. The method of claim 8 wherein configuring the first transistor includes configuring the first transistor as an emitter follower.

18. The method of claim 8 wherein configuring the first transistor includes configuring the first transistor as a source follower.

* * * * *